US012683587B2

(12) United States Patent
Hayashimoto et al.

(10) Patent No.: US 12,683,587 B2
(45) Date of Patent: Jul. 14, 2026

(54) SEMICONDUCTOR DEVICE AND SEMICONDUCTOR SYSTEM

(71) Applicant: Renesas Electronics Corporation, Tokyo (JP)

(72) Inventors: Hajime Hayashimoto, Tokyo (JP); Kenji Sewaki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 48 days.

(21) Appl. No.: 18/954,702

(22) Filed: Nov. 21, 2024

(65) Prior Publication Data

US 2025/0192759 A1 Jun. 12, 2025

(30) Foreign Application Priority Data

Dec. 8, 2023 (JP) ................................. 2023-207599

(51) Int. Cl.
| | |
|---|---|
| *H03K 3/356* | (2006.01) |
| *H03K 19/00* | (2006.01) |
| *H03K 19/0185* | (2006.01) |
| *H03K 19/21* | (2006.01) |

(52) U.S. Cl.
CPC .................. *H03K 3/356113* (2013.01); *H03K 19/018571* (2013.01)

(58) Field of Classification Search
None
See application file for complete search history.

(56) References Cited

U.S. PATENT DOCUMENTS

| | | | | |
|---|---|---|---|---|
| 5,179,298 A | * | 1/1993 | Hirano ................. | H03K 17/162 326/27 |
| 5,583,457 A | * | 12/1996 | Horiguchi .......... | H03K 19/0016 327/544 |
| 5,959,927 A | * | 9/1999 | Yamagata ........... | G11C 11/4074 365/63 |
| 10,262,985 B2 | * | 4/2019 | Robins ................. | H10D 89/601 |

FOREIGN PATENT DOCUMENTS

JP 2007332705 A 12/2007

* cited by examiner

*Primary Examiner* — Anh Q Tran
(74) *Attorney, Agent, or Firm* — SCULLY, SCOTT, MURPHY & PRESSER, P.C.

(57) ABSTRACT

A semiconductor device includes a first power supply voltage line to which a power supply voltage is supplied, a second power supply voltage line, a first impedance element provided between the first power supply voltage line and the second power supply voltage line, a first reference voltage line to which a reference voltage is supplied, a second reference voltage line, a second impedance element provided between the first reference voltage line and the second reference voltage line, an electronic circuit provided between the second power supply voltage line and the second reference voltage line and performing a predetermined processing on an input signal, and provided in series between the second power supply voltage line and the second reference voltage line, and having gates connected to drains, a first transistor which is a P-channel MOS transistor, and a second transistor which is an N-channel MOS transistor.

10 Claims, 14 Drawing Sheets

SEMICONDUCTOR DEVICE AND SEMICONDUCTOR SYSTEM

CROSS-REFERENCE TO RELATED APPLICATION

This application claims priority under 35 U.S.C. § 119 to Japanese Patent Application No. 2023-207599 filed on Dec. 8, 2023. The disclosure of Japanese Patent Application No. 2023-207599, including the specification, drawings and abstract, is incorporated herein by reference in its entirety.

BACKGROUND

The present disclosure relates to a semiconductor device and a semiconductor system equipped with the same, for example, concerning a semiconductor device and a semiconductor system suitable for achieving low power consumption.

There are disclosed techniques listed below.

[Patent Document 1] Japanese Unexamined Patent Application Publication No. 2007-332705

There is a demand for reducing power consumption in semiconductor systems. In particular, in recent years, for example, there has been a demand for reducing standby power consumption in systems such as keyless entry systems installed in vehicles and alarm systems installed in vehicles. That is, in recent years, there has been a demand for reducing standby power consumption in semiconductor systems and semiconductor devices installed therein. An example of technologies related to keyless entry systems are disclosed in Patent Document 1.

SUMMARY

As described above, there is a demand for reducing standby power consumption in semiconductor devices and semiconductor systems equipped with them. Other objects and novel features will become apparent from the description of this specification and the accompanying drawings.

The semiconductor device according to the present disclosure includes a first power supply voltage line to which a power supply voltage is supplied, a second power supply voltage line, a first impedance element provided between the first power supply voltage line and the second power supply voltage line, a first reference voltage line to which a reference voltage is supplied, a second reference voltage line, a second impedance element provided between the first reference voltage line and the second reference voltage line, an electronic circuit provided between the second power supply voltage line and the second reference voltage line and performing a predetermined processing on an input signal, and a first transistor, which is a P-channel MOS transistor, and a second transistor, which is an N-channel MOS transistor, both provided in series between the second power supply voltage line and the second reference voltage line, and each having their gates connected to their drains.

The present disclosure can provide a semiconductor device and a semiconductor system equipped with the same, capable of achieving low power consumption.

DETAILED DESCRIPTION

Figure 1:
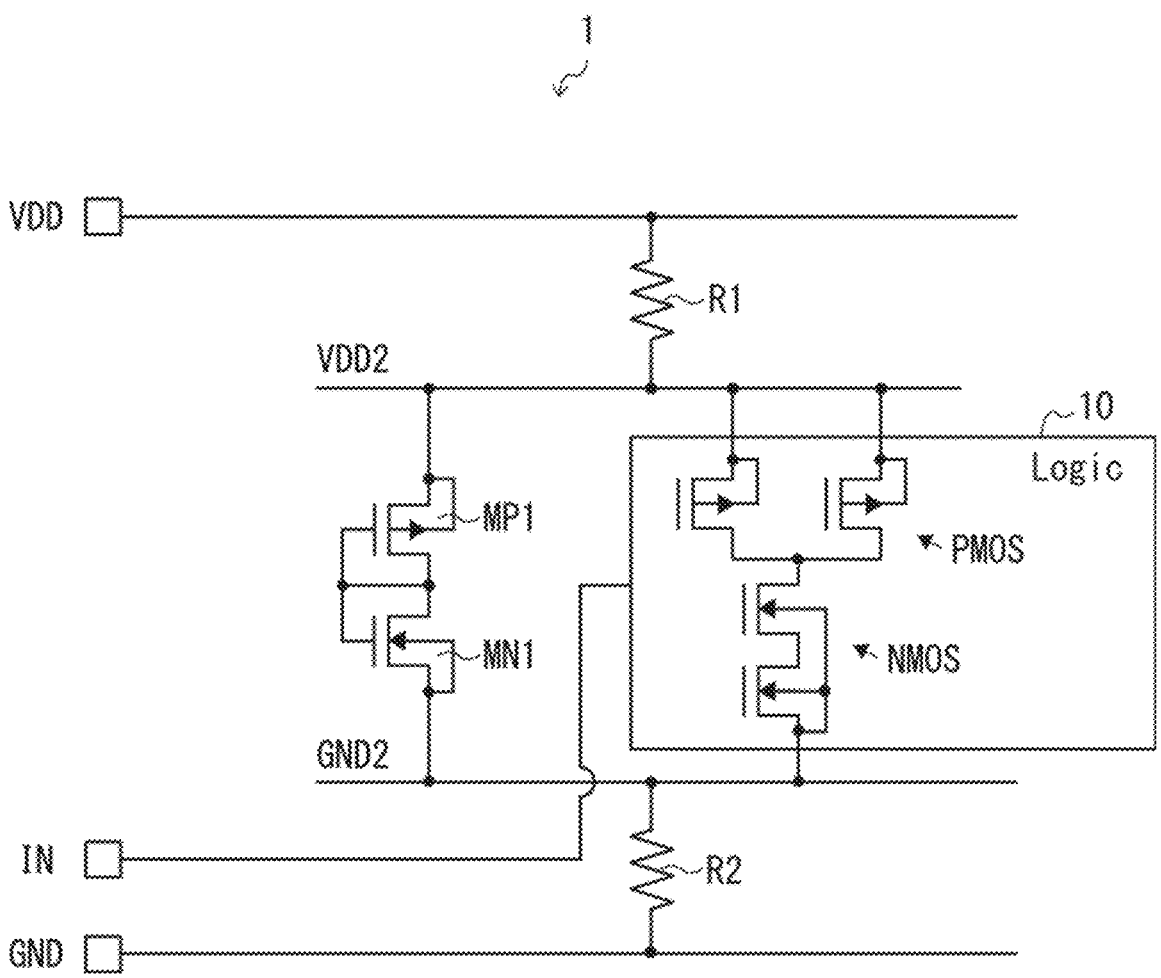
FIG. 1 is a diagram showing a configuration example of a semiconductor device according to a first embodiment.

Hereinafter, embodiments will be described with reference to the drawings. It should not be interpreted narrowly the technical scope of the embodiments based on the description of the drawings, as the drawings are simplified. Also, the same reference numerals are assigned to the same elements, and redundant descriptions are omitted.

For convenience, when necessary, the following embodiments are described in multiple sections or divided into different embodiments. However, unless specifically stated otherwise, they are not unrelated to each other; one may relate to the other as a part or all in the form of modifications, applications, detailed explanations, supplementary explanations, etc. Moreover, in the following embodiments, when referring to the number of elements, etc. (including the number of elements, numerical values, quantities, ranges, etc.), it is not limited to the specific number, but may be not less than or equal to the specific number, except for cases where the number is specifically indicated and is clearly limited to the specific number in principle.

Furthermore, in the following embodiments, the constituent elements (including the operation steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above-mentioned numbers and the like, including the number, the numerical value, the amount, the range, and the like.

Preliminary Examination by the Inventors

Figure 13:
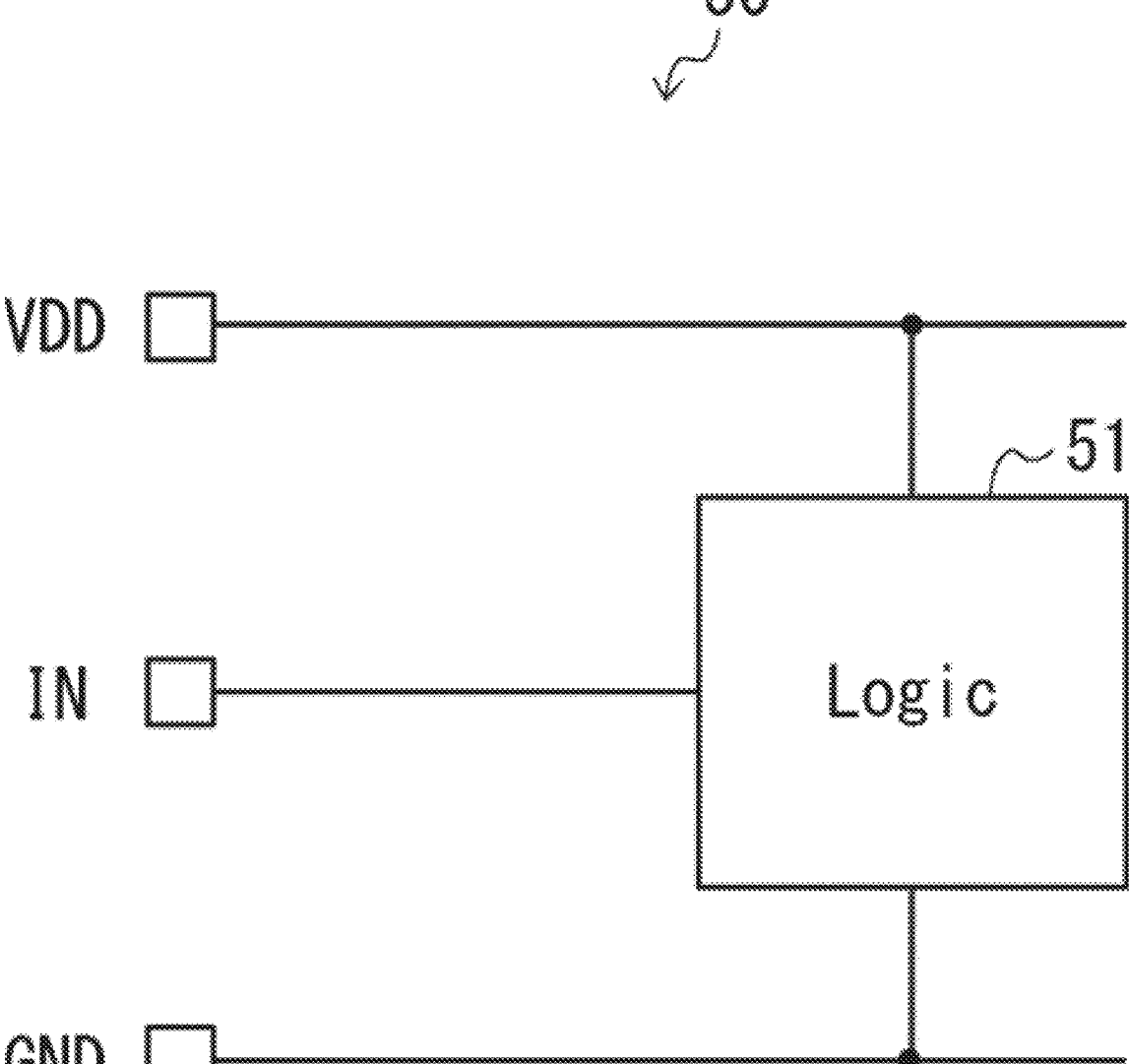
FIG. 13 is a diagram showing a configuration example of a semiconductor device that was pre-examined.

First, a semiconductor device that was preliminarily examined by the inventors will be described. FIG. 13 is a diagram showing an example of the configuration of the preliminarily examined semiconductor device 50.

As shown in FIG. 13, the semiconductor device 50 includes a power supply voltage terminal to which an external power supply voltage VDD is supplied, a reference voltage terminal to which an external reference voltage GND is supplied, an input terminal to which an external input signal IN is supplied, and a logic circuit (electronic circuit) 51.

For example, the power supply voltage VDD indicates 3.3V and the reference voltage GND indicates 0V. Hereinafter, the line to which the power supply voltage VDD is supplied is referred to as the first power supply voltage line VDD, and the line to which the reference voltage GND is supplied is referred to as the first reference voltage line GND. The logic circuit 51 is provided between the first power supply voltage line VDD and the first reference voltage line GND and performs a predetermined process on the input signal IN. In other words, the logic circuit 51 is driven by the power supply voltage VDD and the reference voltage GND and performs a predetermined process on the input signal IN.

Here, the lower the average consumption current (dark current) of the logic circuit 51, the more the power consumption of the semiconductor device 50 is suppressed. For example, if the semiconductor device 50 is installed in a vehicle as part of a keyless entry system, the lower the dark current of the logic circuit 51, the more the consumption of the power stored in the vehicle's battery is suppressed.

Figure 14:
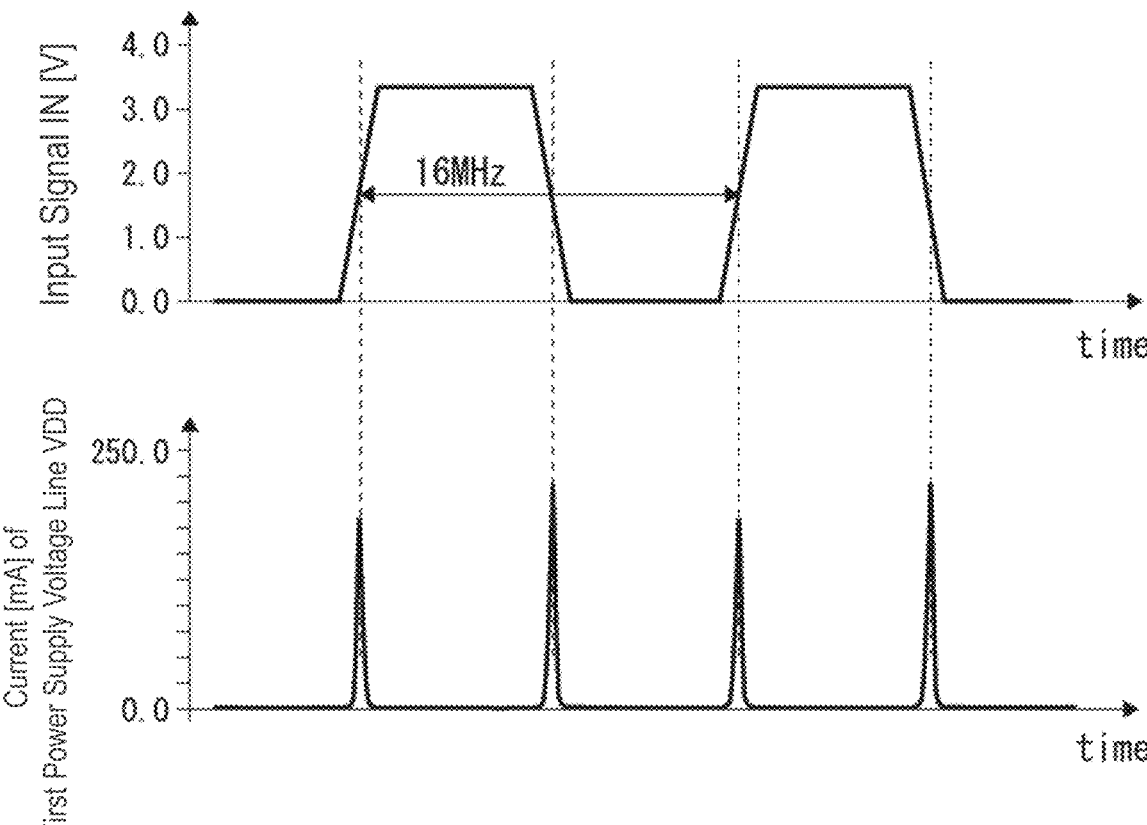
FIG. 14 is a waveform diagram showing the operation of the semiconductor device shown in FIG. 13.

FIG. 14 is a waveform diagram showing the operation of the semiconductor device 50. In FIG. 14, the scale of the logic circuit 51 is equivalent to 2K gates in terms of NAND gates, the frequency of the main clock signal supplied to the logic circuit 51 is 16 MHz, and the operation rate of the logic circuit 51 is assumed to be 50%. In this case, the peak current of the logic circuit 51 is indicated as 225 mA, and the average consumption current (dark current) of the logic circuit 51 is indicated as 4.8 mA. In recent years, there has been a demand for further reduction in the average power consumption of logic circuits 51.

Therefore, a semiconductor device 1 capable of realizing low power consumption has been found.

First Embodiment

FIG. 1 is a diagram showing an example of the configuration of the semiconductor device 1 according to a first embodiment. For example, the semiconductor device 1 is applicable to a keyless entry system mounted on a vehicle or an alarm system mounted on a vehicle.

As shown in FIG. 1, the semiconductor device 1 includes a power supply voltage terminal to which an external power supply voltage VDD is supplied, a reference voltage terminal to which an external reference voltage GND is supplied, an input terminal to which an external input signal IN is supplied, a resistive element (first impedance element) R1, a resistive element (second impedance element) R2, a transistor (first transistor) MP1 which is a P-channel MOS transistor, a transistor (second transistor) MN1 which is an N-channel MOS transistor, and a logic circuit (electronic circuit) 10.

For example, the power supply voltage VDD indicates 3.3V and the reference voltage GND indicates 0V. Hereinafter, the line to which the power supply voltage VDD is supplied is referred to as the first power supply voltage line VDD, and the line to which the reference voltage GND is supplied is referred to as the first reference voltage line GND. The resistive element R1 is provided between the first power supply voltage line VDD and the second power supply voltage line VDD2. The resistive element R2 is provided between the first reference voltage line GND and the second reference voltage line GND2.

The logic circuit 10 is provided between the second power supply voltage line VDD2 and the second reference voltage line GND2 and performs a predetermined process on the input signal IN. In other words, the logic circuit 10 is driven by the power supply voltage (hereinafter referred to as the power supply voltage VDD2) of the second power supply voltage line VDD2 and the reference voltage (hereinafter referred to as the reference voltage GND2) of the second reference voltage line GND2, and performs a predetermined process on the input signal IN. The sources and back gates of each P-channel MOS transistor provided in the logic circuit 10 are connected to the second power supply voltage line VDD2. Furthermore, the sources and back gates of each N-channel MOS transistor provided in the logic circuit 10 are connected to the second reference voltage line GND2.

Transistors MP1, MN1 are serially provided between the second power supply voltage line VDD2 and the second reference voltage line GND2. Specifically, in transistor MP1, the source and back gate are connected to the second power supply voltage line VDD2, and the gate and drain are connected to the gate and drain of transistor MN1. In transistor MN1, the source and back gate are connected to the second reference voltage line GND2. By providing transistors MP1, MN1, the power supply voltage of the second power supply voltage line VDD2 and the reference voltage of the second reference voltage line GND2 are stabilized.

Here, the smaller the dark current of logic circuit 10, the more suppressed is the power consumption of semiconductor device 1. For example, when semiconductor device 1 is mounted in a vehicle, the smaller the dark current of logic circuit 10, the more suppressed is the consumption of power stored in the vehicle's battery.

Figure 2:
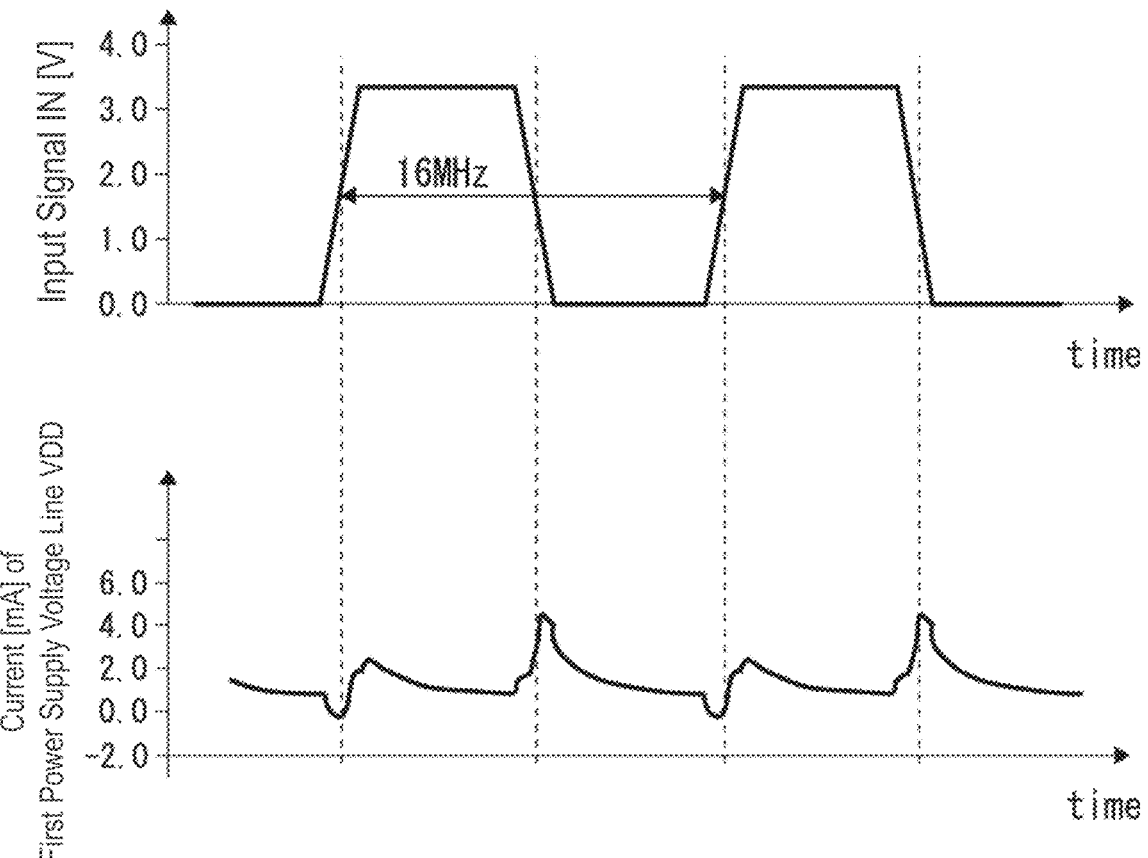
FIG. 2 is a waveform diagram showing the operation of the semiconductor device shown in FIG. 1.

FIG. 2 is a waveform diagram showing the operation of semiconductor device 1. In FIG. 2, the scale of logic circuit 10 is 2K gates when converted into NAND gates, the frequency of the main clock signal supplied to logic circuit 10 is 16 MHZ, and the operation rate of logic circuit 10 is assumed to be 50%. In this case, the average consumption current of logic circuit 10 is shown to be 1.4 mA, which is an improvement over the case of logic circuit 51.

Specifically, if the gate charge-discharge current of the operating transistors provided in logic circuit 10 is denoted as I_sw, and the through current of the operating transistors provided in logic circuit 10 is denoted as I_leak, then the average consumption current of logic circuit 10, that is, the dark current I_dark of logic circuit 10, is represented by the following equation (1).

$$I\_dark = I\_sw + I\_leak \tag{1}$$

Furthermore, if the frequency of the main clock signal supplied to logic circuit 10 is denoted as f, the gate capacitance of the operating transistors provided in logic circuit 10 is denoted as C, and the amplitude of the clock signal is denoted as Vf, then the gate charge-discharge current I_sw is represented by the following equation (2).

$$I\_sw = f \times C \times Vf \tag{2}$$

Here, if the power supply voltage VDD is denoted as VDD, and the resistance values of resistive elements R1, R2 are denoted as R1, R2, then the amplitude of the clock signal Vf is represented by the following equation (3).

$$Vf = VDD - (I\_dark \times (R1 + R2)) \qquad (3)$$

If the threshold voltage of each transistor is denoted as Vt, then from equation (3), equation (4) holds.

$$I\_leak \propto (Vf - Vt)^2 \qquad (4)$$

That is, the through current I_leak is proportional to $(Vf-Vt)^2$.

For example, in the logic circuit 51 provided in semiconductor device 50 shown in FIG. 13, the amplitude of the clock signal Vf is VDD=3.3V, whereas in the logic circuit 10 provided in semiconductor device 1 shown in FIG. 1, the amplitude of the clock signal Vf is VDD−(I_dark×(R1+R2)) <3.3 V. That is, in the logic circuit 10 provided in the semiconductor device 1, compared to the case of the logic circuit 51 provided in the semiconductor device 50, the amplitude of the clock signal Vf is smaller, resulting in smaller gate charge-discharge current I_sw and through current I_leak, and as a result, the dark current I_dark is reduced. Designers and the like can effectively suppress the dark current I_dark of the logic circuit 10 provided in the semiconductor device 1 by previously understanding the maximum value of the dark current I_dark and, for example, adjusting the resistance values of the resistive elements R1, R2 so that the amplitude Vf of the clock signal becomes smaller within the operable range of the logic circuit 10.

Thus, the semiconductor device 1 according to the present embodiment includes a second power supply voltage line VDD2 connected to the first power supply voltage line VDD via the resistive element R1, and a second reference voltage line GND2 connected to the first reference voltage line GND via the resistive element R2, between which are provided the logic circuit 10 and transistors MP1, MN1 connected in series. Therefore, the semiconductor device 1 according to the present embodiment can reduce the amplitude Vf of the clock signal supplied to the logic circuit 10 within the operable range of the logic circuit 10, thereby reducing the dark current of the logic circuit 10. In other words, the semiconductor device 1 according to the present embodiment can achieve low power consumption.

Second Embodiment

Figure 3:
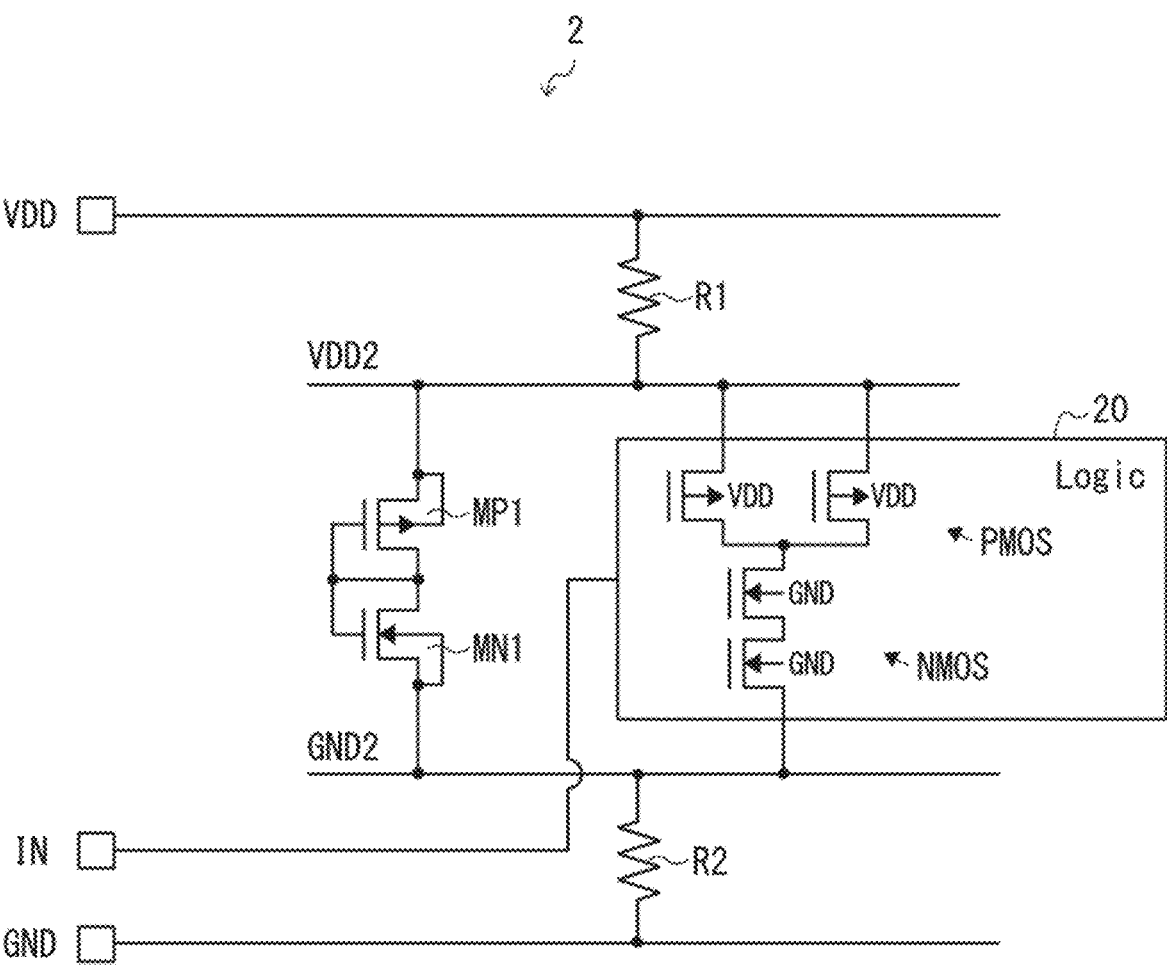
FIG. 3 is a diagram showing a configuration example of a semiconductor device according to a second embodiment.

FIG. 3 is a diagram showing an example of the configuration of the semiconductor device 2 according to a second embodiment.

As shown in FIG. 3, the semiconductor device 2 includes the logic circuit 20 instead of the logic circuit 10 compared to the semiconductor device 1. The back gates of each P-channel MOS transistor provided in the logic circuit 20 are connected to the first power supply voltage line VDD instead of the second power supply voltage line VDD2. The back gates of each N-channel MOS transistor provided in the logic circuit 20 are connected to the first reference voltage line GND instead of the second reference voltage line GND2. The other configurations of the semiconductor device 2 are the same as those of the semiconductor device 1, and their description is omitted.

When simulations were performed under the same conditions as for the semiconductor device 1, the average consumption current (dark current) of the logic circuit 20 showed 679 µA, which was an improvement over the case of the logic circuit 10. This is because, as shown in the aforementioned equation (4), the threshold voltage Vt of each transistor increased due to the back gate effect, resulting in a smaller leakage current I_leak.

Thus, the semiconductor device 2 can achieve effects equal to or greater than those of the semiconductor device 1.

In the present embodiment, the case where all the back gates of the P-channel MOS transistors in the logic circuit 20 are connected to the first power supply voltage line VDD, and all the back gates of the N-channel MOS transistors are connected to the first reference voltage line GND is described as an example, but it is not limited to this. It is only necessary that at least some of the back gates of the P-channel MOS transistors in the logic circuit 20 are connected to the first power supply voltage line VDD, and at least some of the back gates of the N-channel MOS transistors are connected to the first reference voltage line GND.

Third Embodiment

Figure 4:
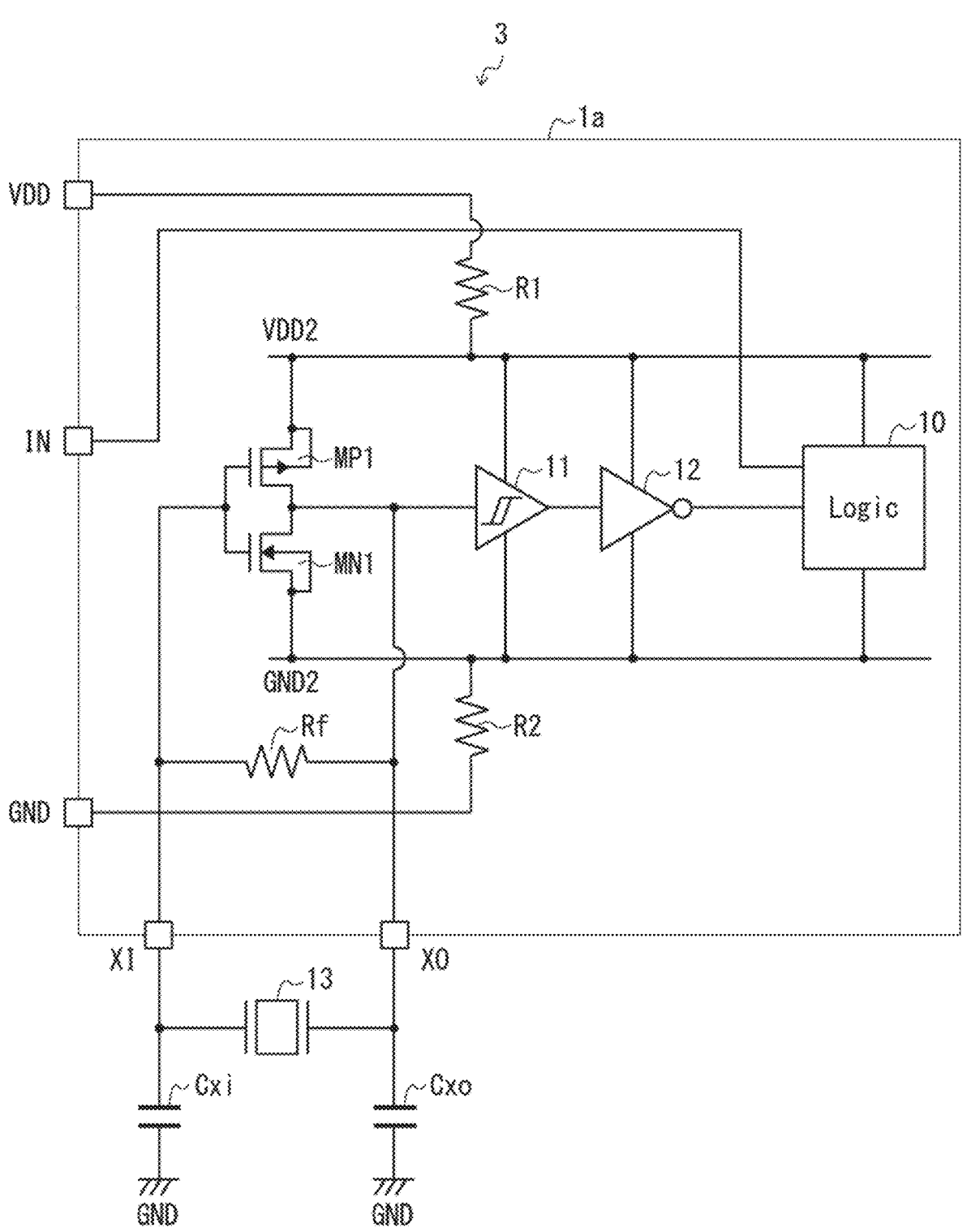
FIG. 4 is a diagram showing a configuration example of a semiconductor system according to a third embodiment.

FIG. 4 is a diagram showing an example of the configuration of the semiconductor system 3 according to a third embodiment. The semiconductor system 3 applies the configuration of the semiconductor device 1. The semiconductor system 3 is used, for example, in a keyless entry system installed in a vehicle.

Specifically, the semiconductor system 3 comprises a semiconductor device 1a, a crystal oscillator 13, a capacitive element (first capacitive element) Cxi, and a capacitive element (second capacitive element) Cxo. Furthermore, the semiconductor device 1a further comprises, in addition to the components of the semiconductor device 1, a feedback resistor Rf, a buffer 11, and an inverter 12.

In the semiconductor device 1a, the gates of the transistors MP1, MN1 are each connected to the external terminal XI, and the drains of the transistors MP1, MN1 are each connected to the external terminal XO. The crystal oscillator 13 is provided between the external terminal XI and external terminal XO of the semiconductor device 1a, outside the semiconductor device 1a. That is, the crystal oscillator 13 is provided between the gates of the transistors MP1, MN1 and the drains of the transistors MP1, MN1, via the external terminals XI, XO of the semiconductor device 1a.

The capacitive element Cxi is provided between the external terminal XI of the semiconductor device 1a and the reference voltage terminal GND, outside the semiconductor device 1a. The capacitive element Cxo is provided between the external terminal XO of the semiconductor device 1a and the reference voltage terminal GND, outside the semiconductor device 1a.

In the semiconductor device 1a, the feedback resistor Rf is provided between the gates of the transistors MP1, MN1 and the drains of the transistors MP1, MN1. The buffer 11 is a so-called Schmitt buffer, which drives and outputs the output signals of the drains of the transistors MP1, MN1. The inverter 12 outputs the inverted signal of the output signal of the buffer 11. The output signal of the inverter 12 is supplied to the logic circuit 10 as a clock signal.

Figure 5:
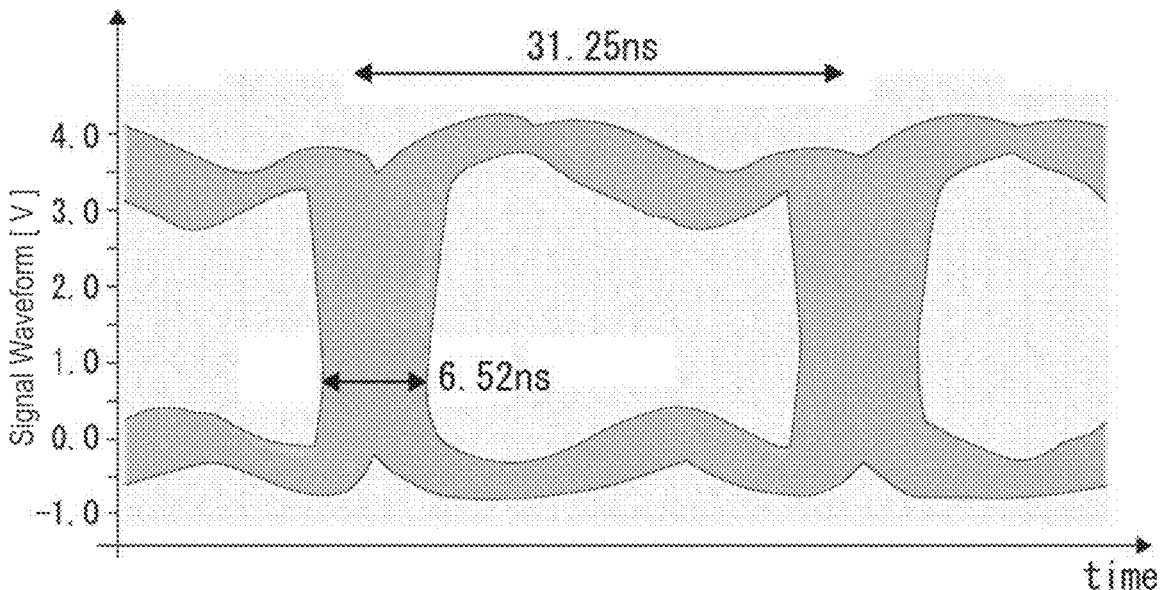
FIG. 5 is a diagram showing simulation results of EYE opening in a comparative example of a semiconductor system.

FIG. 5 is a diagram showing the simulation results of the EYE opening (EYE pattern) in the semiconductor system of the comparative example. In the semiconductor system of the comparative example, compared to the semiconductor system 3, the resistance values of the resistive elements R1, R2 are set to 002. Therefore, the power supply voltage VDD2 of the second power supply voltage line VDD2 indicates the same 3.3V as the power supply voltage VDD. Furthermore, the power supply voltage GND2 of the second reference voltage line GND2 indicates the same 0V as the reference voltage GND.

In FIG. 5, the oscillation frequency of the crystal oscillator 13 is 16 MHz, the scale of the logic circuit 10 is 40K gates when converted to NAND gates, the frequency of the main clock signal supplied to the logic circuit 10 is 16 MHz, and the operation rate of the logic circuit 10 is assumed to be 50%. Furthermore, in FIG. 5, the amplitude of the external noise is assumed to be 3.3V±100 mV, and the frequency of the external noise is assumed to be 40 MHz.

In this case, the semiconductor system of the comparative example showed a jitter of 6.52 nsec/100 mV.

Figure 6:
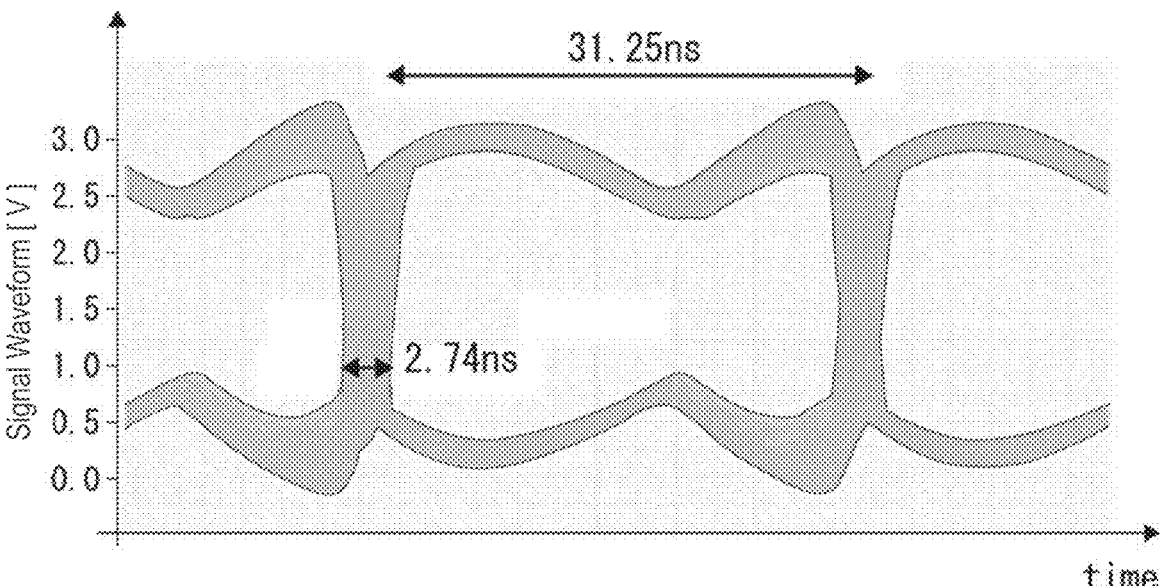
FIG. 6 is a diagram showing simulation results of EYE opening in the semiconductor system shown in FIG. 4.

FIG. 6 is a diagram showing the simulation results of the EYE opening in the semiconductor system 3. In FIG. 6, while the power supply voltage VDD of the first power supply voltage line VDD indicates 3.3V, the power supply voltage VDD2 of the second power supply voltage line VDD2 indicates 2.7V due to the voltage drop by I_dark×R1. Moreover, in FIG. 6, while the reference voltage GND of the first reference voltage line GND indicates 0V, the reference voltage GND2 of the second reference voltage line GND2 indicates 0.5V due to the voltage rise by I_dark×R2.

In the semiconductor system 3, when simulations were conducted under the same conditions as the comparative example semiconductor system except for the resistance values of the resistive elements R1, R2, jitter showed 2.74 nsec/100 mV. That is, in the semiconductor system 3, compared to the case of the comparative example semiconductor system, jitter was suppressed to about 42%.

In recent years, in the automotive industry, IEC62132-4 (DPI method) has been attracting attention as an EMC test for ICs (Integrated Circuits) standardized by the IEC (International Electrotechnical Commission) standard. In this DPI method, even when noise of approximately ±600 mV is superimposed on the 3.3V power supply voltage VDD supplied to the local pin, based on a 50Ω conversion, it is required that the IC does not malfunction. A local pin refers to a pin that is not connected to the outside of the ECU but is connected to components including other ICs within the ECU.

Here, there is a proportional relationship between the noise superimposition amount of the power supply voltage VDD and jitter. Therefore, to examine whether the comparative example semiconductor system meets the requirements of the DPI method, when the amplitude of the external noise, that is, the noise superimposition amount of the power supply voltage VDD, was set to 3.3V±600 mV in the simulation conditions of FIG. 5, jitter showed 39.12 nsec/100 mV (=6.52×6 nsec/100 mV), and the EYE opening became narrow.

In contrast, to examine whether the semiconductor system 3 meets the requirements of the DPI method, when the amplitude of the external noise, that is, the noise superimposition amount of the power supply voltage VDD, was set to 3.3V±600 mV in the simulation conditions of FIG. 6, jitter showed 16.44 nsec/100 mV (=2.74×6 nsec/100 mV), and the EYE opening was maintained in a wide state. That is, the semiconductor system 3 can maintain the EYE opening in a wide state without using external components such as an external low-pass filter. In other words, the semiconductor system 3 can achieve low jitter.

The low jitter achieved by the semiconductor system 3 is explained more specifically. For example, when +100 mV of noise is superimposed on the power supply voltage VDD, the power supply voltage VDD2 also increases instantaneously by ΔVDD. At this time, the gate-source voltage of each of the transistors MP1, MN1 increases instantaneously, and current flows through the transistors MP1, MN1 and the resistive element R2, causing the reference voltage GND2 to also increase instantaneously by ΔGND. Thus, the potential difference between the power supply voltage VDD2 and the reference voltage GND2 is maintained almost constant even when noise occurs. That is, the semiconductor system 3 can achieve low jitter because it is less affected by noise.

Thus, the semiconductor system 3, having an oscillation circuit to which the configuration of the semiconductor device 1 is applied, can not only achieve low power consumption similar to the semiconductor device 1 but also maintain a wide EYE opening without using external components such as external low-pass filters, thereby realizing low jitter.

Fourth Embodiment

Figure 7:
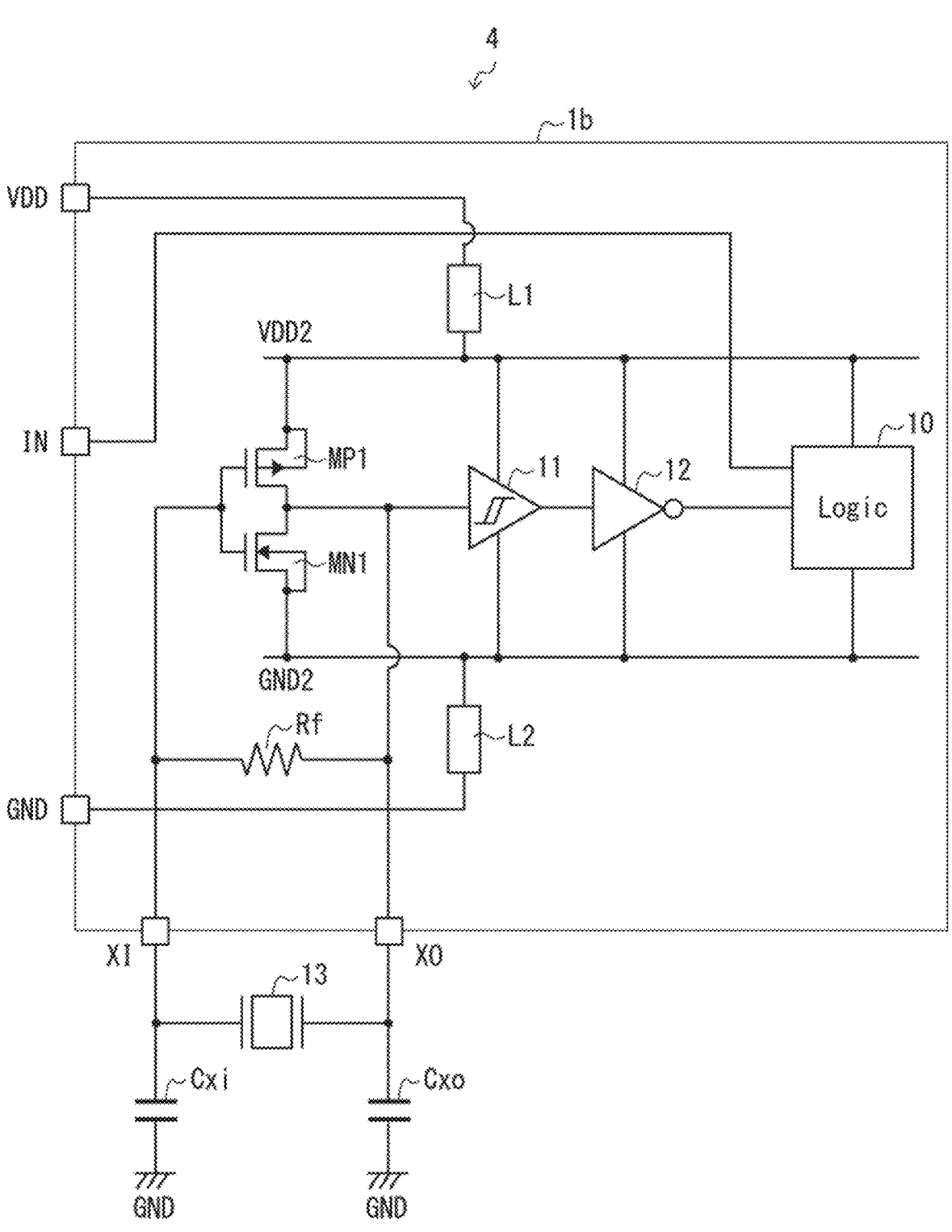
FIG. 7 is a diagram showing a configuration example of a semiconductor system according to a fourth embodiment.

FIG. 7 is a diagram showing an example of the configuration of a semiconductor system 4 according to a fourth embodiment. The semiconductor system 4 includes a semiconductor device 1b instead of the semiconductor device 1a in comparison with the semiconductor system 3. The semiconductor device 1b includes pseudo inductance circuits L1, L2 instead of resistance elements R1, R2. The pseudo inductance circuits L1, L2 are configured to form a pseudo inductance circuit by using transistors or the like instead of coils. Thus, the semiconductor device 1b can suppress an increase in circuit size more than when using coils. The other configurations of the semiconductor system 4 are the same as those of the semiconductor system 3, and therefore, the description thereof is omitted.

Figure 8:
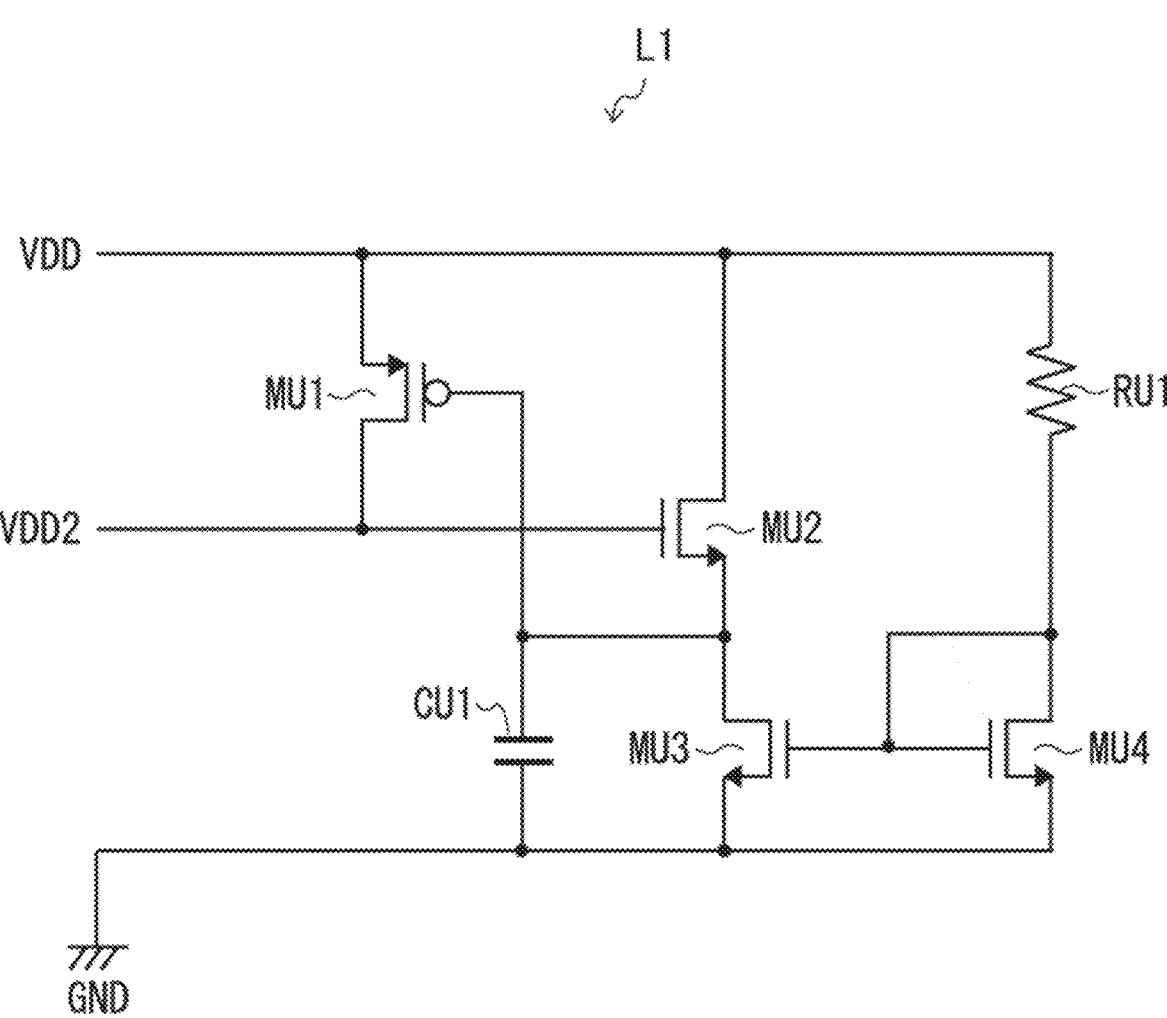
FIG. 8 is a diagram showing a specific configuration example of a first pseudo impedance circuit provided in the semiconductor system shown in FIG. 7.

FIG. 8 is a diagram showing a specific example of the configuration of the pseudo inductance circuit L1. As shown in FIG. 8, the pseudo inductance circuit L1 includes transistors MU1 to MU4, a capacitance element CU1, and a resistance element RU1. Transistor MU1 is a P-channel MOS transistor, and transistors MU2 to MU4 are N-channel MOS transistors.

In transistor MU1, the source is connected to a first power supply voltage line VDD, and the drain is connected to a second power supply voltage line VDD2. The capacitance element CU1 is provided between the gate of transistor MU1 and a first reference voltage line GND. In transistor MU2, the source is connected to the gate of transistor MU1, the drain is connected to the first power supply voltage line VDD, and the gate is connected to the second power supply voltage line VDD2. In transistor MU3, the source is connected to the first reference voltage line GND, and the drain is connected to the source of transistor MU2. The resistance element RU1 is provided between the first power supply voltage line VDD and the gate of transistor MU3. In transistor MU4, the source is connected to the first reference voltage line GND, and both the drain and the gate are connected to the gate of transistor MU3.

Figure 9:
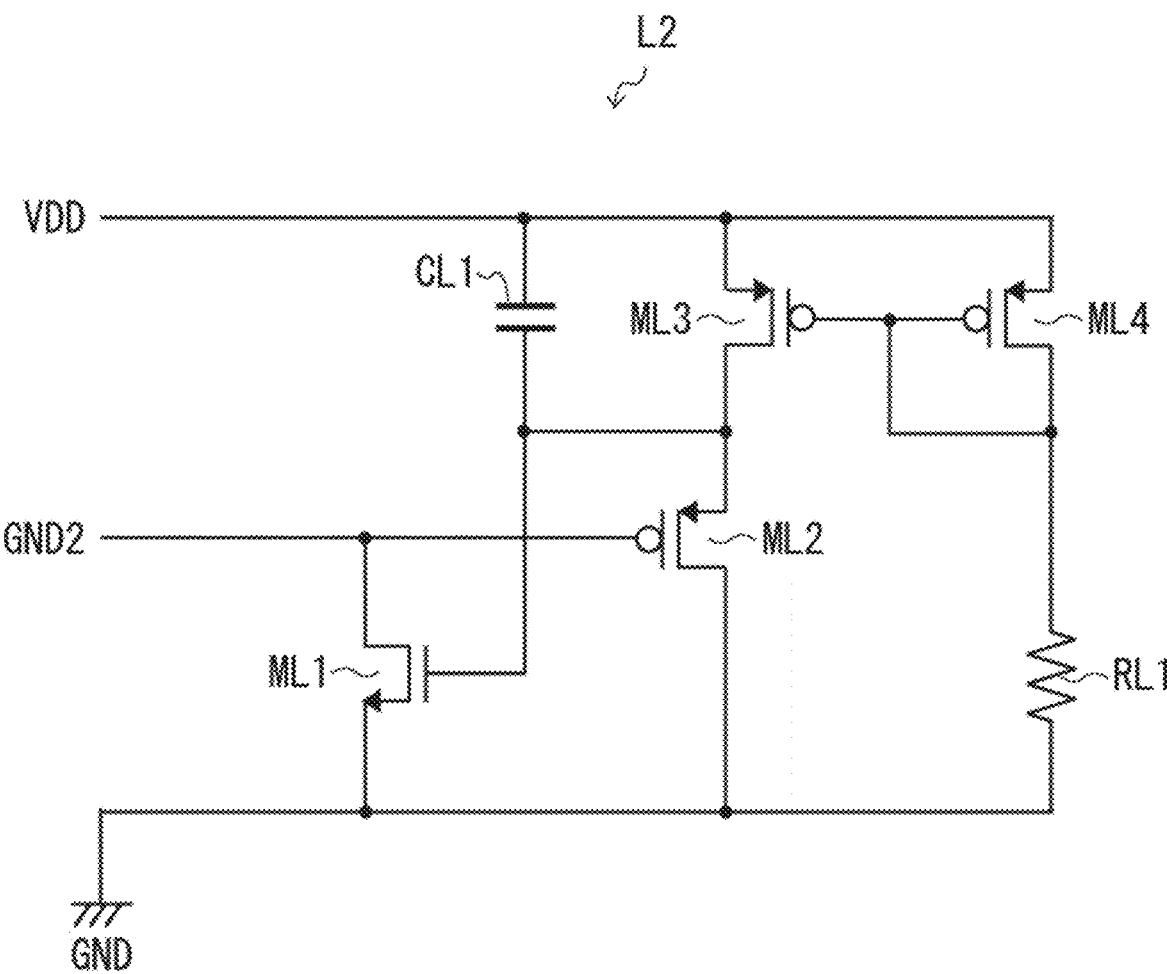
FIG. 9 is a diagram showing a specific configuration example of a second pseudo impedance circuit provided in the semiconductor system shown in FIG. 7.

FIG. 9 is a diagram showing a specific example of the configuration of the pseudo inductance circuit L2. As shown in FIG. 9, the pseudo inductance circuit L2 includes transistors ML1 to ML4, a capacitance element CL1, and a resistance element RL1. Transistor ML1 is an N-channel MOS transistor, and transistors ML2 to ML4 are P-channel MOS transistors.

In the transistor ML1, the source is connected to the first reference voltage line GND, and the drain is connected to the second reference voltage line GND2. The capacitive element CL1 is provided between the gate of the transistor ML1, and the first power supply voltage line VDD. In the transistor ML2, the source is connected to the gate of the transistor ML1, the drain is connected to the first reference voltage line GND, and the gate is connected to the second reference voltage line GND2. In the transistor ML3, the source is connected to the first power supply voltage line VDD, and the drain is connected to the source of the transistor ML2. The resistive element RL1 is provided between the first reference voltage line GND and the gate of the transistor ML3. In the transistor ML4, the source is connected to the first power supply voltage line VDD, and both the drain and the gate are connected to the gate of the transistor ML3.

Figure 10:
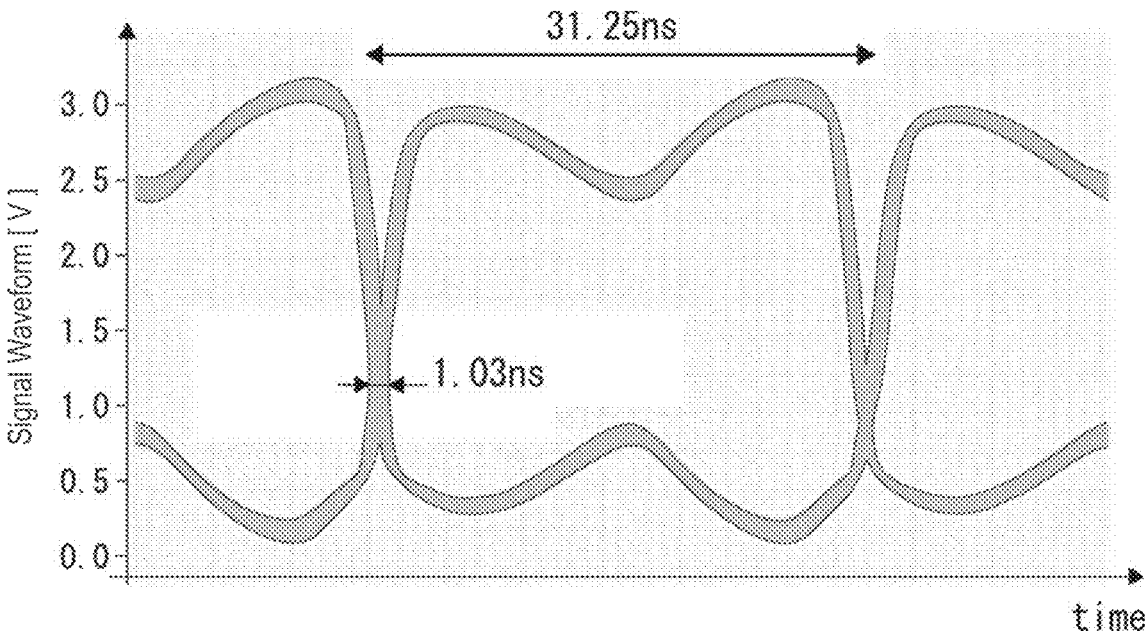
FIG. 10 is a diagram showing simulation results of EYE opening in the semiconductor system shown in FIG. 7.

FIG. 10 is a diagram showing the simulation results of the EYE opening in the semiconductor system 4. When a simulation was performed under the same conditions as in the semiconductor system 3 in the semiconductor system 4, the jitter showed 1.03 nsec/100 mV. That is, in the semiconductor system 4, jitter is further suppressed compared to the semiconductor system 3.

Furthermore, in order to examine whether the semiconductor system 4 meets the requirements of the DPI method, among the simulation conditions of FIG. 10, when the amplitude of the noise superimposed on the power supply voltage VDD, that is, the amplitude of the external noise is set to 3.3V±600 mV, the jitter shows 6.18 nsec/100 mV (=1.03×6 nsec/100 mV), and the EYE opening is maintained in a wide state. That is, the semiconductor system 4 can maintain the EYE opening in a wider state compared to the semiconductor system 3. In other words, the semiconductor system 4 can further reduce jitter compared to the semiconductor system 3.

Figure 11:
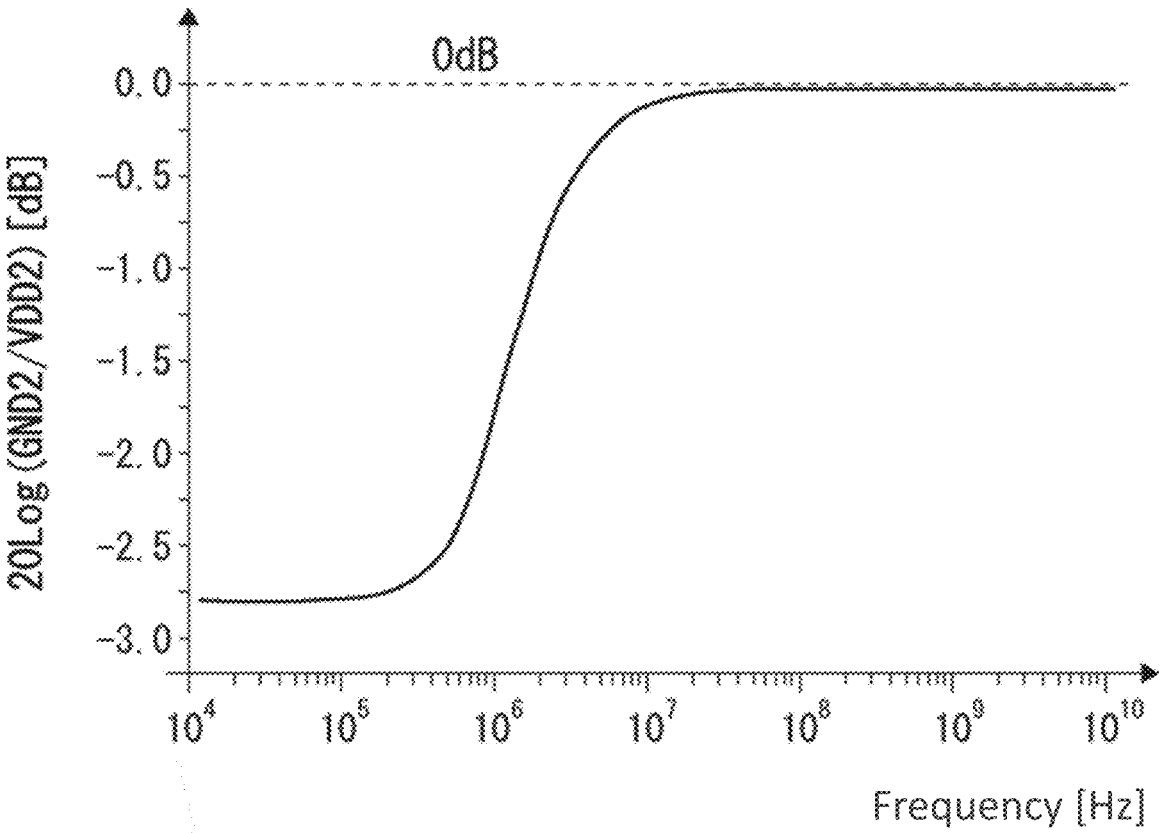
FIG. 11 is a diagram showing AC analysis results of the semiconductor system shown in FIG. 7 when noise is applied to the power supply voltage VDD.

FIG. 11 is a diagram showing the AC analysis results of the semiconductor system 4 when noise is applied to the power supply voltage VDD. In FIG. 11, the vertical axis represents 20 Log (GND2/VDD2), and the horizontal axis represents the frequency in logarithmic notation. As shown in FIG. 11, in the semiconductor system 4, due to the provision of pseudo-inductance circuits L1, L2 instead of resistive elements R1, R2, the followability of the reference voltage GND2 to the power supply voltage VDD2 is improved for frequencies above 10 MHz. Therefore, the semiconductor system 4 can further reduce jitter compared to the semiconductor system 3.

Figure 12:
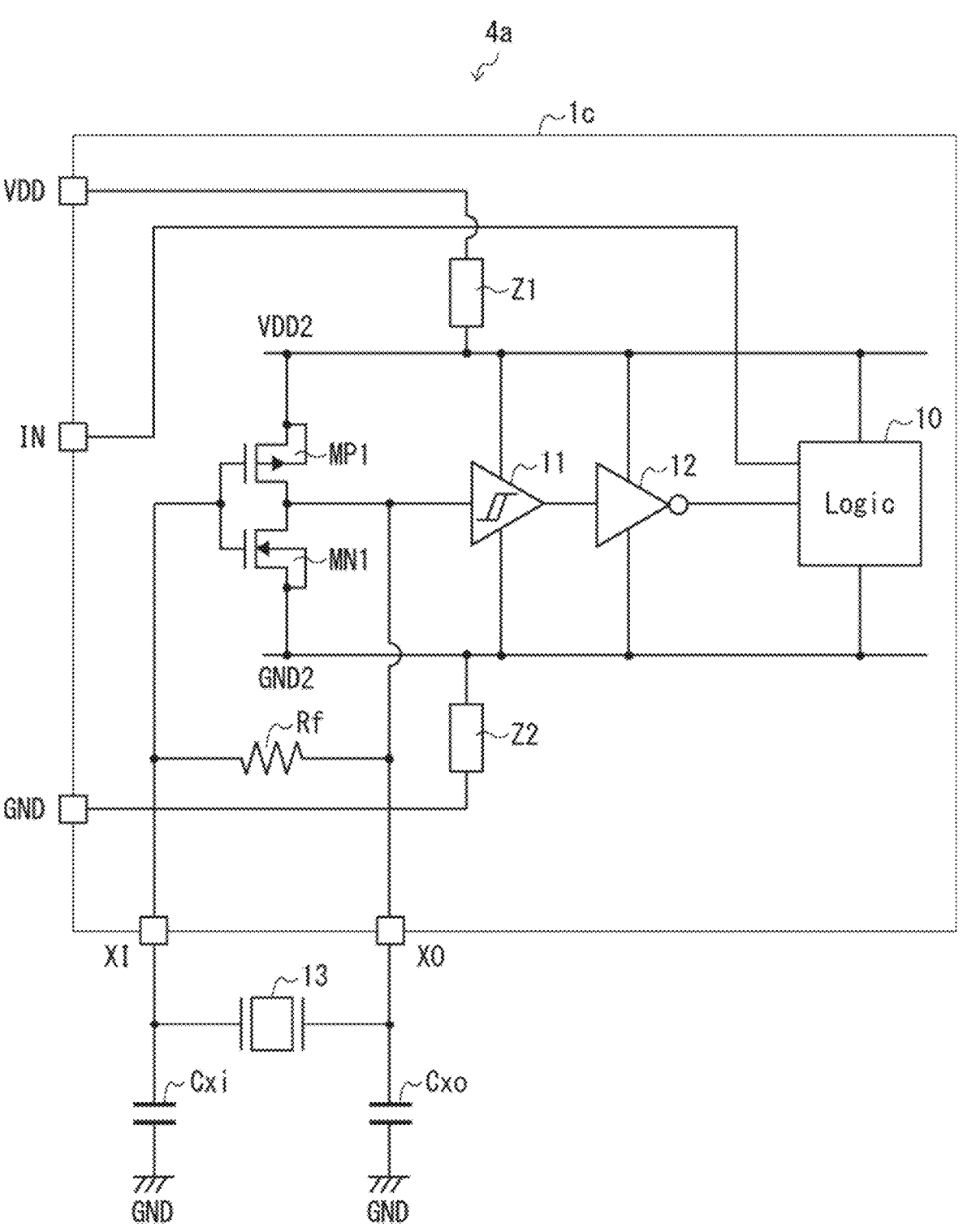
FIG. 12 is a diagram showing a modified example of the semiconductor system shown in FIG. 7.

In the present embodiment, the case where the semiconductor system 4 is equipped with pseudo-inductance circuits L1, L2 instead of resistive elements R1, R2 is described as an example, but it is not limited to this. As shown in FIG. 12, the semiconductor system 4 may be equipped with impedance elements Z1, Z2 capable of realizing functions equivalent to those of resistive elements R1, R2 or pseudo-inductance circuits L1, L2, etc.

FIG. 12 is a diagram showing a modified example of the semiconductor system 4 as semiconductor system 4a. The semiconductor system 4a is equipped with semiconductor device 1c instead of semiconductor device 1b compared to the semiconductor system 4. The semiconductor device 1c is equipped with impedance elements Z1, Z2 instead of resistive elements R1, R2. The other configurations of the semiconductor system 4a are the same as those of the semiconductor system 4, and therefore, the description thereof is omitted.

As described above, the semiconductor device according to the present disclosure includes a second power supply voltage line VDD2 connected to the first power supply voltage line VDD via resistive element R1, and a second reference voltage line GND2 connected to the first reference voltage line GND via resistive element R2, between them, a logic circuit, and transistors MP1, MN1 connected in series, are provided. Thereby, the semiconductor device according to the present disclosure can reduce the amplitude Vf of the clock signal supplied to the logic circuit within the operational range of the logic circuit, thereby reducing the dark current of the logic circuit. In other words, the semiconductor device according to the present disclosure can achieve low power consumption.

Furthermore, a semiconductor system having an oscillation circuit, to which the configuration of the semiconductor device disclosed herein is applied, can not only achieve low power consumption but also maintain a wide EYE opening without using external components such as an external low-pass filter, thereby realizing low jitter.

Although the invention made by the inventor has been specifically described based on the embodiment, the present invention is not limited to the embodiment already described, and it is needless to say that various modifications can be made without departing from the gist thereof.

For example, in this disclosure, the case where the semiconductor device 1 includes resistance elements R1, R2 has been described as an example, but it is not limited to this. The semiconductor device 1 can be appropriately modified to a configuration including impedance elements Z1, Z2 such as pseudo inductance circuits L1, L2 instead of the resistance elements R1, R2. Similarly, in this disclosure, the case where the semiconductor device 2 includes resistance elements R1, R2 has been described as an example, but it is not limited to this. The semiconductor device 2 can be appropriately modified to a configuration including impedance elements Z1, Z2 such as pseudo inductance circuits L1, L2 instead of the resistance elements R1, R2.

Moreover, in this disclosure, the case where the semiconductor system 3 includes the semiconductor device 1 has been described as an example, but it is not limited to this. The semiconductor system 3 can be appropriately modified to a configuration including the semiconductor device 2 instead of the semiconductor device 1. In other words, the semiconductor system 3 can be appropriately modified to a configuration including logic circuit 20 instead of logic circuit 10. Similarly, in this disclosure, the case where the semiconductor system 4 includes the semiconductor device 1 has been described as an example, but it is not limited to this. The semiconductor system 4 can be appropriately modified to a configuration including the semiconductor device 2 instead of the semiconductor device 1. In other words, the semiconductor system 4 can be appropriately modified to a configuration including logic circuit 20 instead of logic circuit 10.

Furthermore, this disclosure can be implemented by executing a computer program on a CPU to perform some or all of the processes of the semiconductor system including semiconductor device 1, semiconductor device 2, or either of them.

The program mentioned above, when loaded into a computer, includes a group of instructions (or software code) for causing the computer to perform one or more functions described in the embodiment. The program may be stored on a non-transitory computer-readable medium or a tangible storage medium. By way of example and not limitation, non-transitory computer-readable media or tangible storage media may include RAM (Random-Access Memory), ROM (Read-Only Memory), flash memory, SSD (Solid-State Drive) or other memory technologies, CD-ROM, DVD (Digital Versatile Disc), Blu-ray (registered trademark) disc or other optical disc storage, magnetic cassette, magnetic tape, magnetic disk storage or other magnetic storage devices. The program may also be transmitted on a transitory computer-readable medium or communication medium. By way of example and not limitation, transitory computer-readable media or communication media may include electrical, optical, acoustical, or other forms of propagated signals.

What is claimed is:

1. A semiconductor device comprising:
a first power voltage line to which a power voltage is supplied;
a second power voltage line;
a first impedance element provided between said first power voltage line and said second power voltage line;
a first reference voltage line to which a reference voltage is supplied;
a second reference voltage line;
a second impedance element provided between said first reference voltage line and said second reference voltage line;
an electronic circuit provided between said second power voltage line and said second reference voltage line, configured to perform a predetermined processing on an input signal; and
a first transistor and a second transistor,
wherein the first transistor is a P-channel MOS transistor, the second transistor is an N-channel MOS transistor, and both the first transistor and the second transistor are provided in series between said second power voltage line and said second reference voltage line, and each having its gate connected to its drain; in the semiconductor device.

2. The semiconductor device according to claim 1, wherein the first impedance element and the second impedance element are both resistive elements.

3. The semiconductor device according to claim 1, wherein:
the first impedance element is constituted by a first pseudo inductance circuit, and the first pseudo inductance circuit comprising:
a first upper side transistor, wherein the first upper side transistor is a P-channel MOS transistor provided between the first power supply voltage line and the second power supply voltage line,
a first upper side capacitive element provided between the gate of the first upper side transistor, and the first reference voltage line,
a second upper side transistor, which is an N-channel MOS transistor provided between the first power supply voltage line and the gate of the first upper side transistor, with the gate connected to the second power supply voltage line,
a third upper side transistor, which is an N-channel MOS transistor provided between the source of the second upper side transistor and the first reference voltage line,
a first upper side resistive element provided between the first power supply voltage line and the gate of the third upper side transistor, and a fourth upper side transistor, which is an N-channel MOS transistor provided between the gate of the third upper side transistor and the first reference voltage line, with the gate connected to the gate of the third upper side transistor; and
the second impedance element is constituted by a second pseudo inductance circuit, and the second pseudo inductance circuit comprising:
a first lower side transistor, which is an N-channel MOS transistor provided between the first reference voltage line and the second reference voltage line,
a first lower side capacitive element provided between the gate of the first lower side transistor, and the first power supply voltage line,
a second lower side transistor, which is a P-channel MOS transistor provided between the first reference voltage line and the gate of the first lower side transistor, with the gate connected to the second reference voltage line,
a third lower side transistor, which is a P-channel MOS transistor provided between the source of the second lower side transistor and the first power supply voltage line,
a first lower side resistive element provided between the first reference voltage line and the gate of the third lower side transistor, and
a fourth lower side transistor, which is a P-channel MOS transistor provided between the gate of the third lower side transistor and the first power supply voltage line, with the gate connected to the gate of the third lower side transistor.

4. The semiconductor device according to claim 1, wherein in the first transistor, the source and back gate are connected to the second power supply voltage line, and the gate and drain are connected to the gate and drain of the second transistor; and
wherein in the second transistor, the source and back gate are connected to the second reference voltage line.

5. The semiconductor device according to claim 1, wherein the back gates of each P-channel MOS transistor provided in the electronic circuit are connected to the second power supply voltage line, and the back gates of each N-channel MOS transistor provided in the electronic circuit are connected to the second reference voltage line.

6. The semiconductor device according to claim 1, wherein the back gates of some of the multiple P-channel MOS transistors provided in the electronic circuit are connected to the first power supply voltage line, and the back gates of some of the multiple N-channel MOS transistors provided in the electronic circuit are connected to the first reference voltage line.

7. The semiconductor device according to claim 1, wherein the back gates of all the multiple P-channel MOS transistors provided in the electronic circuit are connected to the first power supply voltage line, and the back gates of all the multiple N-channel MOS transistors provided in the electronic circuit are connected to the first reference voltage line.

8. A semiconductor system comprising:
the semiconductor device according to claim 1;
a crystal oscillator provided between the gates and the drains of both the first and second transistors; and
first and second capacitive elements provided between both ends of the crystal oscillator and a reference voltage terminal;

wherein the semiconductor device further comprises a feedback resistor provided in parallel with the crystal oscillator, a buffer that drives and outputs the output signals of the drains of both the first and second transistors, and an inverter that outputs the inverted signal of the output signal of the buffer as a clock signal supplied to the electronic circuit.

9. The semiconductor system according to claim 8, wherein the buffer is a Schmitt buffer.

10. The semiconductor system according to claim 8, wherein the semiconductor system is applied to a keyless entry system mounted on a vehicle.

* * * * *